United States Patent [19]
Nakaso et al.

[11] Patent Number: 5,444,189
[45] Date of Patent: Aug. 22, 1995

[54] PRINTED WIRING BOARD AND PRODUCTION THEREOF

[75] Inventors: Akishi Nakaso, Oyama; Kouichi Tsuyama, Shimodate; Akinari Kida, Tochigi; Shuichi Hatakeyama; Naoyuki Urasaki, both of Shimodate, all of Japan

[73] Assignee: Hitachi Chemical Co., Ltd., Tokyo, Japan

[21] Appl. No.: 77,722

[22] Filed: Jun. 17, 1993

[51] Int. Cl.⁶ .................................................. H05K 1/00
[52] U.S. Cl. ..................... 174/262; 174/255; 174/257; 174/263
[58] Field of Search ............... 174/250, 255, 257, 262, 174/263, 264, 265, 266; 361/784, 792

[56] References Cited

U.S. PATENT DOCUMENTS 4,374,868  2/1983  Stahl et al. .
5,072,075  12/1991  Lee et al. .

FOREIGN PATENT DOCUMENTS 1665015  12/1970  Germany .
3111396  4/1982  Germany .
2194696  1/1990  Japan .

OTHER PUBLICATIONS

Patent Abstracts of Japan, Application No. 64-14808, Oct. 17, 1990, vol. 14, No. 476.

*Primary Examiner*—Leo P. Picard
*Assistant Examiner*—Cheryl R. Figlin
*Attorney, Agent, or Firm*—Antonelli, Terry, Stout & Kraus

[57] ABSTRACT

A wiring board comprising one or more inner layer circuit substrates and outer circuit layers formed from metal foil layers on both sides of said dinner layer circuit substrates via prepregs, said inner layer circuit substrate comprising an insulating layer and metal foil layers formed on both sides of said insulating layer, at least one inner layer circuit substrate or said outer circuit layers or both having hollow portions in the metal foil layer filled with an electroconductive substance, said wiring board having one or more through-holes at least in the hollow portions and filled with the electroconductive substance, has high reliability and a high wiring density.

9 Claims, 4 Drawing Sheets

PRINTED WIRING BOARD AND PRODUCTION THEREOF

BACKGROUND OF THE INVENTION

The present invention relates to an inexpensive printed wiring board having a high wiring density as well as to a process for producing such a wiring board efficiently.

Printed wiring boards have been produced by a subtractive process which comprises drilling holes at the positions of a copper-clad laminate requiring electrical connection, coating the walls of the holes with a metal by electroless plating or electroplating, and removing the unnecessary portions of the conductor (copper) by etching; an additive process which comprises drilling holes in an insulating substrate and applying electroless plating to the walls of the holes as well as to the necessary parts of the substrate surface to form conductor circuits; a semiadditive process which comprises drilling holes in the same manner as in the subtractive process, then removing the unnecessary portions of the copper foil, and coating only the walls of the holes with a metal by electroless plating; and processes similar thereto.

Figure 2:
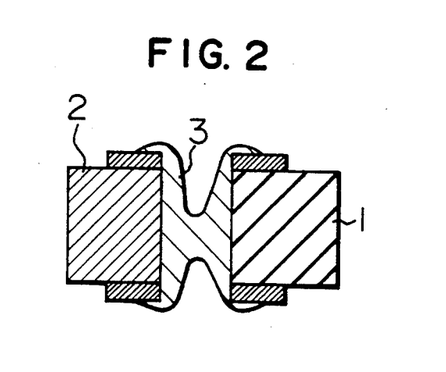
FIG. 2 is a sectional view showing the key portion of a prior art wiring board.
Figure 3:
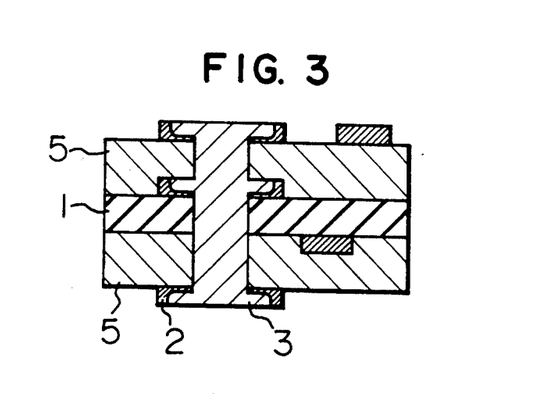
FIG. 3 is a sectional view showing the key portion of another example of the wiring board of the present invention.

Meanwhile, in order to produce a wiring board inexpensively by forming circuits without applying plating, it has long been conducted to coat the walls of the holes with a silver or copper paste comprising particles of said metal, a binder and a solvent, as shown in FIG. 2, or to form circuits with said paste per se. It is also known to coat the walls of the holes with a solder paste and melt the paste to complete connection.

Of the above processes for production of a wiring board, those using plating have been used for production of a wiring board of high connection reliability. With the recent spread of electronic appliances, it is strongly required to provide electronic appliances of high performance with low cost.

In the above processes for wiring board production using plating, the time for plating cannot be made shorter than now and a fairly large apparatus is required because particular apparatuses for plating are required and the plating solution must be controlled.

Thus, under the current situation, the efficiency of wiring board production has a limitation as long as plating is employed.

In the processes for producing a wiring board inexpensively, as shown in FIG. 2, the coating of an electroconductive paste is unable to achieve the complete filling of the hole inside; the connection area is small; the connection resistance is large; as a result, only a wiring board of small wiring density such as one-side circuit board or two-side-circuit board is obtained. In the above process applying an electroconductive paste by printing, it is impossible to form complicated circuits and the connection reliability is too low to produce a multilayer wiring board. Thus, it is difficult to produce a wiring board of high performance using inexpensive materials.

SUMMARY OF THE INVENTION

The present invention is intended to produce an inexpensive printed wiring board having a high wiring density and a process for producing such a wiring board efficiently.

The present invention provides a wiring board for inner layer circuit comprising an insulating layer and metal foil layers formed on both sides of the insulating layer, said metal foil layers having one or more hollow portions in which holes are to be drilled, said hollow portions being filled with an electroconductive substance.

The present invention further provides a wiring board comprising an insulating layer and metal foil layers formed on both sides of the insulating layer and having one or more holes through the insulating layer and the metal foil layers, narrow areas around the holes in the metal foil layers being hollowed, and hollow portions and holes being filled with an electroconductive substance.

The present invention still further provides a wiring board comprising one or more inner layer circuit substrates and outer circuit layers formed from metal foil layers on both sides of said inner layer circuit substrates via prepregs, said inner layer circuit substrates comprising an insulating layer and metal foil layers formed on both sides of said insulating layer, at least one inner layer circuit substrate or said outer circuit layers or both having hollow portions in the metal foil layer filled with an electroconductive substance, said wiring board having one or more through-holes at least in the hollow portions and filled with the electroconductive substance.

The present invention also provides processes for producing these wiring boards.

DESCRIPTION OF THE PREFERRED EMBODIMENTS

The wiring board for inner layer circuit of the present invention comprises an insulating layer and metal foil layers formed on both sides of the insulating layer, said metal foil layers having one or more hollow portions in which holes are to be drilled, said hollow portions being filled with an electroconductive substances, wherein the metal foil is a copper foil, or a composite metal foil comprising a core metal layer and a copper layer formed on one side or both sides of the core metal layer, said core metal layer and said copper layer being different in chemically removing conditions.

The wiring board of the present invention also comprises an insulating layer and metal foil layers formed on both sides of the insulating layer and having one or more holes through the insulating layer and the metal foil layers, narrow areas around the holes in the metal foil layers being hollowed, and hollow portions and holes being filled with an electroconductive substances, wherein the metal foil is a copper foil, or a composite metal foil comprising a core metal layer and a copper layer formed on one side or both sides of the core metal layer, said core metal layer and said copper layer being different in chemically removing conditions and the hollow portions being formed in either said core metal layer or said copper layer.

The wiring board of the present invention further comprises one or more inner layer circuit substrates and outer circuit layers formed from metal foil layers on both sides of said inner layer circuit substrates via pre-pregs, said inner layer circuit substrate comprising an insulating layer and metal foil layers formed on both sides of said insulating layer, at least one inner layer circuit substrate or said outer circuit layers or both having hollow portions in the metal foil layer filled with an electroconductive substance, said wiring board having one or more through-holes at least in the hollow portions and filled with the electroconductive substance, wherein the metal foil is a copper foil, or a composite metal foil comprising a core metal layer and a copper layer formed on one side or both sides of the core metal layer, said core metal layer and said copper layer being different in chemically removing conditions and the hollow portions being formed in either said core metal layer or said copper layer.

In this case, one of the outer circuit layers can be omitted and the outermost inner layer circuit can act as the omitted outer circuit layer.

The wiring boards of the present invention can be produced by various processes.

For example, the wiring board can be produced by
laminating a pair of metal foil on both sides of an insulating substrate not completely cured, followed by pressing with heating.
drilling one or more holes in the resulting laminate necessary for connecting circuits,
removing the metal foil in narrow areas around the holes to form hollow portions in the metal foil, and
filling a flowable electroconductive substance in the holes and hollow portions, wherein the metal foil is a copper foil or a composite metal foil comprising a core metal layer and a copper layer formed on one side or both sides of the core metal layer, said core metal layer and said copper layer being different in chemically removing conditions, and the hollow portions being formed in only the core metal layer or copper layer.

The hollow portions can be formed in the metal foil in the portions wherein holes are to be drilled prior to drilling holes.

The wiring board can also be produced by
laminating a prepreg and a metal foil on both sides of one or more inner circuit substrates, followed by pressing with heating,
drilling one or more holes in the resulting laminate necessary for connecting circuits.
removing the metal foil in narrow areas around the holes to form hollow portions in the metal foil, and
filling a flowable electroconductive substance in the holes and the hollow portions, wherein the metal foil is a copper foil or a composite metal foil comprising a core metal layer and a copper layer formed on one side or both sides of the core metal layer, said core metal layer and said copper layer being different in chemically removing conditions, and the hollow portions being formed in only the core metal layer or copper layer.

In the above process, the hollow portions can be formed in the metal foil in the portions wherein holes are to be drilled prior to drilling holes.

The above-mentioned processes can further comprise hardening the flowable electroconductive substance,
removing protuberant portions of the electroconductive substance above the surrounding level,
covering with a resist surface portions necessary for forming circuit conductors including the hardened electroconductive substance, and
removing exposed portions from the resist by etching to form outer layer circuits.

The wiring board can further be produced by
laminating a pair of metal foil on both sides of an insulating substrate not completely cured, followed by pressing with heating,
drilling one or more holes in the resulting laminate necessary for connecting circuits,
removing the metal foil in narrow areas around the holes to form hollow portions in the metal foil,
filling a flowable electroconductive substance in the holes and the hollow portions, followed by hardening thereof,
removing protuberant portions of the electroconductive substance above the surrounding level,
covering with a resist surface portions necessary for forming circuit conductors including the hardened electroconductive substance.
removing exposed portions from the resist by etching to form an inner layer circuit substrate,
laminating a prepreg and a metal foil on both sides of one or more inner layer circuit substrates thus produced, followed by pressing with heating,
drilling one or more holes in the resulting laminate necessary for connecting circuits,
forming a metal layer on inner walls of the holes by plating,
covering with a resist the outer metal foils necessary for forming circuits, and
removing unnecessary metal foils by etching to form outer circuit layers, wherein the step of drilling holes in the production of the inner layer circuit substrate can be omitted, and the metal foil is a copper foil or a composite metal foil comprising a core metal layer and a copper layer formed on one side or both sides of the core metal layer, said core metal layer and said copper layer being different in chemically removing conditions, and the hollow portions being formed in only the core metal layer or copper layer.

The wiring board can still further be produced by
laminating a pair of metal foil on both sides of an insulating substrate not completely cured, followed by pressing with heating,
drilling one or more holes in the resulting laminate necessary for connecting circuits,
removing the metal foil in narrow areas around the holes to form hollow portions in the metal foil,
filling a flowable electroconductive substance in the holes and the hollow portions, followed by hardening thereof,
removing protuberant portions of the electroconductive substance above the surrounding level, covering with a resist surface portions necessary for forming circuit conductors including the hardened electroconductive substance, removing exposed portions from the resist by etching to form an inner layer circuit substrate, laminating a prepreg and a metal foil on both sides of one or more inner layer circuit substrates thus produced, followed by pressing with heating, drilling one or more holes in the resulting laminate necessary for connecting circuits, said holes being smaller in diameter than those drilled in the inner layer circuit substrates, removing the metal foil in narrow areas around the holes to form hollow portions in the metal foil, and filling a flowable electroconductive substance in the holes and the hollow portions, wherein the step of drilling holes in the production of the inner layer circuit substrate can be omitted, and the metal foil is a copper foil or a composite metal foil comprising a core metal layer and a copper layer formed on one side or both sides of the core metal layer, said core metal layer and said copper layer being different in chemically removing conditions, and the hollow portions being formed in only the core metal layer or copper layer.

The above-mentioned processes can further comprises hardening the flowable electroconductive substance, removing protuberant portions of the electroconductive substance above the surrounding level, covering with a resist surface portions necessary for forming circuit conductors including the hardened electroconductive substance, and removing exposed portions from the resist by etching to form outer layer circuits, wherein the step of drilling holes in the production of the inner layer circuit substrate can be omitted, and the metal foil is a copper foil or a composite metal foil comprising a core metal layer and a copper layer formed on one side or both sides of the core metal layer, said core metal layer and said copper layer being different in chemically removing conditions, and the hollow portions being formed in only the core metal layer or copper latter.

The present invention is further explained in detail referring to the attached drawings.

Figure 1A:
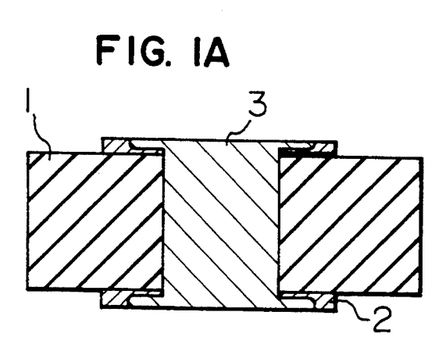
FIGS. 1A and 1B are each a sectional view showing the key portion of an example of the wiring board of the present invention.

The wiring board of the present invention, for example, as shown in FIG. 1A, comprises:

an insulating substrate or an inner layer circuit substrate both having holes formed therein, conductor lands formed on at least one side of the substrate so that each land surrounds the mouth of each hole, the portion of each land adjacent to the mouth of each hole being hollowed as compared with the other portion of each land to form a metallic hollow portion, and an electroconductive substance filling each hole and each metallic hollow portion.

Figure 4A:
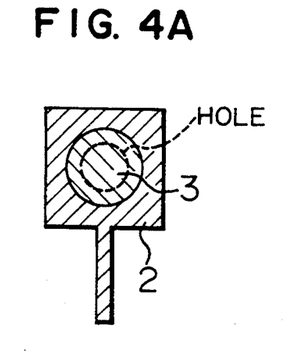
FIGS. 4A and 4B are each a top view showing the key portion of an example of the wiring board of the present invention.
Figure 4B:
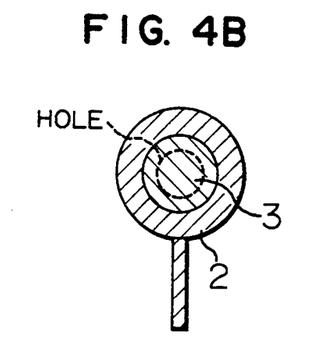

FIGS. 4A and 4B each show the top view of a wiring board having the above structure.

When a flowable electroconductive substance is filled into each hole and each metallic hollow portion as shown in FIG. 1A, the process for production of such a wiring board requires no plating step and is efficient.

Figure 5A:
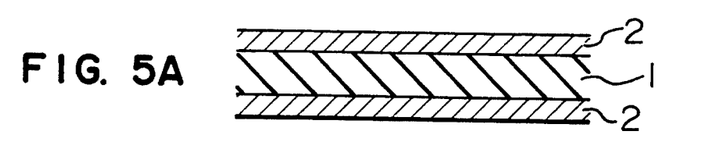
FIGS. 5A to 5E are sectional views explaining the steps of an example of the process of the present invention.
Figure 5B:
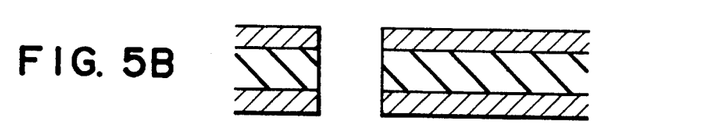
Figure 5C:
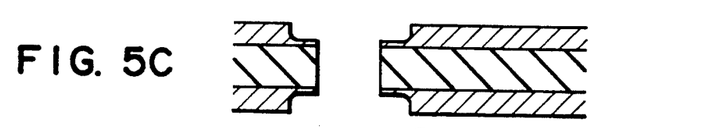
Figure 5D:
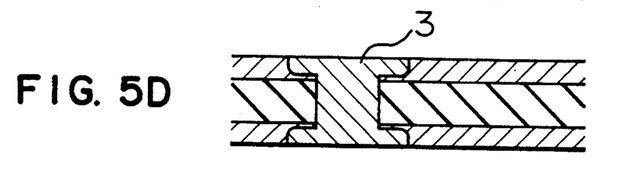

As shown in FIGS. 5A to 5E, the process of the present invention for producing the above-mentioned wiring board comprises:

placing a copper foil on each side of an insulating substrate which is not completely cured, heating them under pressure to form a laminate (shown in FIG. 5A), drilling holes for connection of circuit layers at the required positions of the laminate (shown in FIG. 5B), removing only the portion of each copper foil in narrow areas around the mouth (or opening) of each hole, in such an extent that the insulating substrate is not exposed, to form a metallic hollow portion around the mouth of each hole (shown in FIG. 5C), and filling a flowable electroconductive substance into each hole and each metallic hollow portion (shown in FIG. 5D).

The present process may also comprise:

placing, a copper foil on at least one side of a laminate obtained, by placing a prepreg on at least one side of an inner layer circuit substrate, or a plurality of inner circuit substrates, heating them under pressure to form a laminate, drilling holes for connection of circuit layers at the required positions of the laminate, removing only the portion of each copper foil around the mouth of each hole, in such an extent that the prepreg is not exposed, to form a metallic hollow portion around the mouth of each hole, and filling a flowable electroconductive substance into each hole and each metallic hollow portion.

The present process may further comprise:

placing, on each side of an insulating substrate which is not completely cured, a metal foil which is a laminate of two or three metal layers containing a core metal layer and one or two copper layers formed on one or both sides of the core metal layer, the core metal and the copper being different in chemically removing conditions, heating them under pressure to form a laminate, drilling holes for connection of circuit layers at the required positions of the laminate, removing only the portion of each copper layer around the mouth of each hole, to form a metallic hollow portion around the mouth of each hole, and filling a flowable electroconductive substance into each hole and each metallic hollow portion.

The present process may still further comprise:

placing, on at least one side of a laminate obtained by placing a prepreg on at least one side of an inner layer circuit substrate or a plurality of inner layer circuit substrates, a metal foil which is a laminate of two or three metal layers containing a core metal layer and one or two copper layers formed on one or both sides of the core metal layer, the core metal and the copper being different in chemically removing conditions, heating them under pressure to form a laminate, drilling holes for connection of circuit layers at the required positions of the laminate, removing only the portion of each copper layer around the mouth of each hole, to form a metallic hollow portion around the mouth of each hole, and filling a flowable electroconductive substance into each hole and each metallic hollow portion.

The present process may also comprise:

placing a copper foil on each side of an insulating substrate which is not completely cured, heating them under pressure to form a laminate, removing only the portions of each copper foil of the laminate where holes for circuit connection are to be drilled (the diameter of each of said portions is slightly larger than the diameter of each hole to be drilled), in such an extent that the insulating substrate is not exposed, to form a metallic hollow portion around the mouth of each hole to be drilled, drilling said hole preferably at the center of each metallic hollow portion, and filling a flowable electroconductive substance into each hole and each metallic hollow portion.

The present process may further comprise:

placing a copper foil on at least one side of a laminate obtained by placing a prepreg on at least one side of an inner layer circuit substrate, heating them under pressure to form a laminate, removing only the portions of each copper foil of the laminate where holes for connection of circuit layers are to be drilled (the diameter of each of said portions is slightly larger than the diameter of each hole to be drilled), in such an extent that the prepreg is not exposed, to form a metallic hollow portion around the mouth of each hole to be drilled, drilling said hole preferably at the center of each metallic hollow portion, and filling a flowable electroconductive substance into each hole and each metallic hollow portion.

The present process may further comprise:

placing, on each side of an insulating substrate which is not completely cured, a metal foil which is a laminate of two or three metal layers containing a core metal layer and one or two copper layers formed on one or two sides of the core metal layer, the core metal and the copper being different in chemically removing conditions, heating them under pressure to form a laminate, removing only the portions of each copper layer of the laminate where holes for connection of circuit layers are to be drilled (the diameter of each of said portions is slightly larger than the diameter of each hole to be drilled), to form a metallic hollow portion around the mouth of each hole to be drilled, drilling said hole preferably at the center of each metallic hollow portion, and filling a flowable electroconductive substance into each hole and each metallic hollow portion.

The present process may further comprise:

placing, on at least one side of a laminate obtained by placing a prepreg on at least one side of an inner layer circuit substrate, a metal foil which is a laminate of two or three metal layers containing a core metal layer and one or two copper layers formed on one or two sides of the core metal layer, the core metal and the copper being different in chemically removing conditions, heating them under pressure to form a laminate, removing only the portions of each copper layer of the laminate where holes for connection of circuit layers are to be drilled (the diameter of each of said portions is slightly larger than the diameter of each hole to be drilled), to form a metallic hollow portion around the mouth of each hole to be drilled, drilling said hole preferably at the center of each metallic hollow portion, and filling a flowable electroconductive substance into each hole and each metallic hollow portion.

Figure 5E:
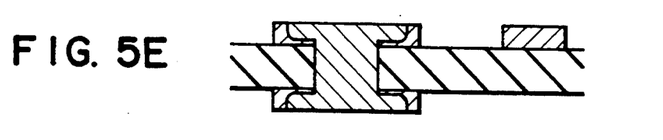

As shown in FIG. 5E, the present process may comprise:

after filling a flowable electroconductive substance 3 into each hole and each metallic hollow portion, hardening the electroconductive substance 3, removing each portion of the electroconductive substance 3 protruding from the plane formed by the surface of the unhollowed portion of each copper foil (i.e, the surrounding level), forming a resist on the portions of each conductor (copper foil) necessary for circuit formation, including the electroconductive substance-filled hollow portions, and removing the exposed (resist-free) portions of each conductor by etching, to obtain a wiring board.

The present process may also comprise:

placing a copper foil on each side of an insulating substrate which is not completely cured, heating them under pressure to form a laminate, drilling holes for connection of circuit layers at the required positions of the laminate, removing only the portion of each copper foil of the laminate around the mouth of each hole, in such an extent that the insulating substrate is not exposed, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each copper foil, forming a resist on the portions of each conductor (copper foil) necessary for circuit formation, including the electroconductive substance-filled hollow portions, removing the exposed (resist-free) portions of each conductor by etching, to form an inner layer circuit substrate, placing a prepreg and a copper foil on at least one side of the inner layer circuit substrate, heating them under pressure to form a laminate, drilling holes for connection of circuit layers at the required positions of the laminate, forming a metal layer on the wall of each hole by plating, forming a resist on the portions of each copper foil (the outermost layer) which are to constitute circuits, and removing the exposed (resist-free) portions of each copper foil by etching, to obtain a multilayer wiring board.

The present process may further comprise:

placing, on each side of an insulating substrate which is not completely cured, a metal foil which is a laminate of two or three metal layers consisting of a core metal layer and one or two copper layers formed on one or both sides of the core metal layer, the core metal and the copper being different in chemically removing conditions, heating them under pressure to form a laminate, making holes for circuit connection at the required positions of the laminate, removing only the portion of each copper layer around the mouth of each hole, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each copper foil, forming a resist on the portions of each conductor (copper foil) necessary for circuit formation, including the electroconductive substance-filled hollow portions, removing the exposed (resist-free) portions of each conductor by etching, to form an inner layer circuit substrate, placing a prepreg and a copper foil on at least one side of the inner layer circuit substrate, heating them under pressure to form a laminate, drilling holes for connection of circuit layers at the required positions of the laminate, forming a metal layer on the wall of each hole by plating, forming a resist on the portions of each copper foil (the outermost layer) which are to constitute circuited, and removing the exposed (resist-free) portions of each copper foil by etching.

Figure 7A:
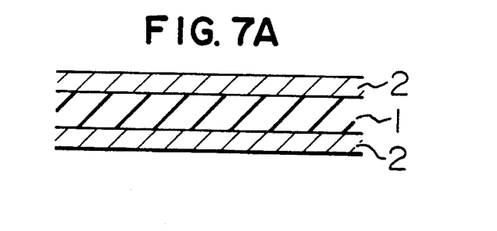
FIGS. 7A to 7H are sectional views explaining the steps of still further example of the process of the present invention.
Figure 7B:
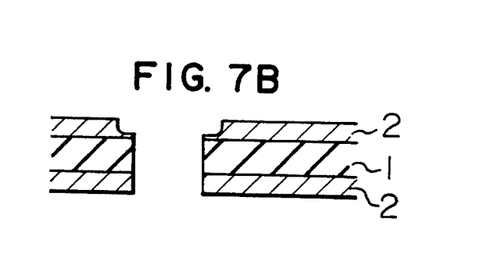
Figure 7C:
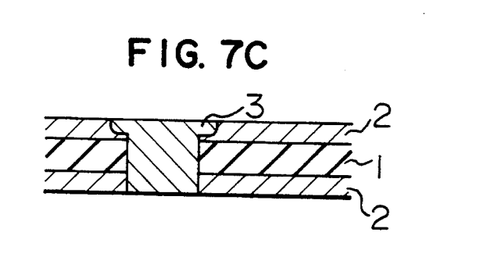
Figure 7D:
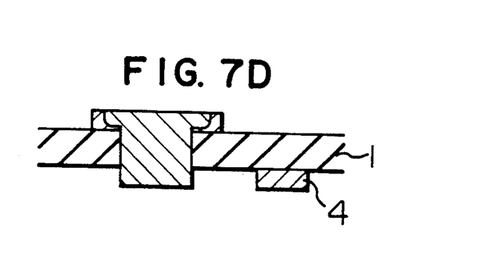
Figure 7E:
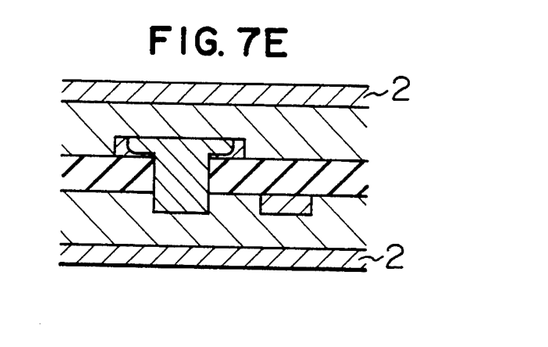
Figure 7F:
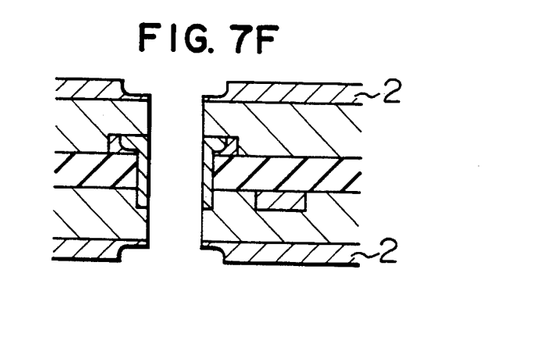
Figure 7G:
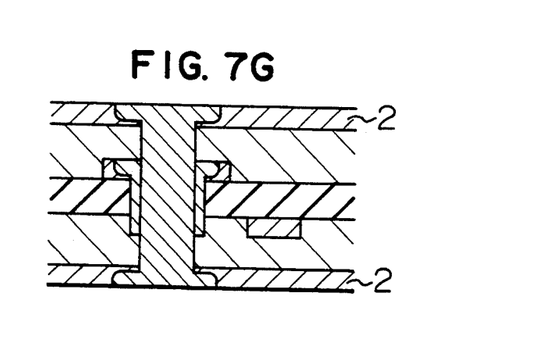

As shown in FIGS. 7A to 7G, the present process may further comprise:

placing a copper foil 2 on each side of an insulating substrate 1 which is not completely cured, heating them under pressure to form a laminate (shown in FIG. 7A), drilling holes for circuit connection at the required positions of the laminate, removing only the portion of each copper foil of the laminate around the mouth of each hole, in such an extent that the insulating substrate 1 is not exposed, to form a metallic hollow portion around the mouth of each hole (shown in FIG. 7B), filling a flowable electroconductive substance 3 into each hole and each metallic hollow portion, hardening the flowable electroconductive substance 3, removing each portion of the electroconductive substance 3 protruding from the plane formed by the surface of the unhallowed portion of each copper foil (shown in FIG. 7C), forming a resist on the portions of each conductor (copper foil) necessary for circuit formation, including the electroconductive substance-filled hollow portions, removing the exposed (resist-free) portions of each conductor by etching (shown in FIG. 7D), to form an inner layer circuit substrate, placing a prepreg 5 and a copper foil 21 on at least one side of the inner layer circuit substrate, heating them under pressure to form a laminate (shown in FIG. 7E), drilling, in the laminate, at least one hole so that the hole passes through one hole of the inner layer circuit substrate filled with the electroconductive substance 2 (accordingly, the diameter of the former hole is smaller than the diameter of the latter hole) and enables connection between inner layer circuit and outer layer circuit (shown in FIG. 7F), removing only the portion of the copper foil 21 around the mouth of each hole drilled above, in such an extent that the prepreg 5 is not exposed, to form a metallic hollow portion around the mouth of each hole, and filling a flowable electroconductive substance 31 into each hole and each metallic hollow portion (shown in FIG. 7G).

The present process may comprise:

placing a copper foil on each side of an insulating substrate which is not completely cured, heating them under pressure to form a laminate, drilling holes for circuit connection at the required positions of the laminate, removing only the portion of each copper foil of the laminate around the mouth of each hole, in such an extent that the insulating substrate is not exposed, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each copper foil, forming a resist on the portions of each conductor (copper foil) necessary for circuit formation, including the electroconductive substance-filled hollow portions, removing the exposed (resist-free) portions of each conductor by etching, to form an inner layer circuit substrate, placing, on at least one side of the inner layer circuit substrate, a prepreg and a metal foil which is a laminate of two or three metal layers consisting of a core metal layer and one or two copper layers formed on one or two sides of the core metal layer, the core metal and the copper being different in chemically removing conditions, heating them under pressure to form a laminate, drilling in the laminate, at least one hole so that the hole passes through one hole of the inner layer circuit substrate filled with the electroconductive substance (accordingly, the diameter of the former hole is smaller than the diameter of the latter hole) and enables connection between inner layer circuit and outer layer circuit, removing only the portion of each copper layer of the laminate around the mouth of each hole to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each outermost copper layer, forming a resist on the portions of each conductor (outermost copper layer) necessary for circuit formation, including the electroconductive substance-filled hollow portions, and removing the exposed (resist-free) portions of each conductor by etching.

The present process may comprise:

placing, on each side of an insulating substrate which is not completely cured, a metal foil which is a laminate of two or three metal layers consisting of a core metal layer and one or two copper layers formed on one or both sides of the core metal layer, the core metal and the copper being different in chemically removing conditions, heating them under pressure to form a laminate, drilling holes for connection of circuit layers at the required positions of the laminate, removing only the portion of each copper or core metal layer of the laminate around the mouth of each hole, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each copper or core metal layer, forming a resist on the portions of each conductor (copper or core metal layer) necessary for circuit formation, including the electroconductive substance-filled hollow portions, removing the exposed (resist-free) portions of each conductor by etching, to form an inner layer circuit substrate, placing a prepreg and a copper foil on at least one side of the inner layer circuit substrate, heating them under pressure to form a laminate, drilling, in the laminate, at least one hole so that the hole passes through one hole of the inner layer circuit substrate filled with the electroconductive substance (accordingly, the diameter of the former hole is smaller than the diameter of the latter hole) and enables connection between inner layer circuit and outer layer circuit, removing only the portion of the copper foil around the mouth of each hole, in such an extent that the prepreg is not exposed, to form a metallic hollow portion around the mouth of each hollow portion, and filling a flowable electroconductive substance into each hole and each metallic hollow portion.

The present process may comprise:

placing, on each side of an insulating substrate which is not completely cured, a metal foil which is a laminate of two or three metal layers consisting of a core metal layer and one or two copper layers formed on one or both sides of the core metal layer, the core metal and the copper being different in removing conditions, heating them under pressure to form a laminate, drilling holes for connection of circuit layers at the required positions of the laminate, removing only the portion of each copper or core metal layer of the laminate around the mouth of each hole, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhallowed portion of each copper or core metal layer, forming a resist on the portions of each conductor (copper or core metal layer) necessary for circuit formation, including the electroconductive substance-filled hollow portions, removing the exposed (resist-free) portions of each conductor by etching, to form an inner layer circuit substrate, placing, on at least one side of the inner layer circuit substrate, a prepreg and the same metal foil as above, heating them under pressure to form a laminate, drilling, in the laminate, at least one hole so that the hole passes through one hole of the inner layer circuit substrate filled with the electroconductive substance accordingly, the diameter of the former hole is smaller than the diameter of the latter hole) and enables connection between inner layer circuit and outer layer circuit, removing only the portion of each copper layer of the laminate around the mouth of each hole, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each outermost copper layer, forming a resist on the portions of each conductor (outermost copper foil) necessary for circuit formation, including the electroconductive substance-filled hollow portions, and removing the exposed (resist-free) portions of each conductor by etching.

The present process may comprise:

placing a copper foil on each side of an insulating substrate which is not completely cured, heating them under pressure to form a laminate, removing only the portions of each copper foil of the laminate where holes for connection of circuit layers are to be drilled (the diameter of each of said portions is slightly larger than the diameter of each hole to be drilled), in such an extent that the insulating substrate is not exposed, to form a metallic hollow portion around the mouth of each hole to be drilled, filling a flowable electroconductive substance into each metallic hollow portion, hardening the flowable electroconductive substance, removing each portion of the electroconductive substance protruding from the plane formed by the surface of the unhollowed portion of each copper layer, forming a resist on the portions of each copper layer necessary for circuit formation, including the electroconductive substance-filled hollow portions, removing the exposed (resist-free) copper layer portions by etching, to form an inner layer circuit substrate, placing a prepreg and a copper foil on at least one side of the inner layer circuit substrate, heating them under pressure to form a laminate, drilling holes for connection of circuit layers at the required positions of the laminate, forming a metal layer on the wall of each hole by plating, forming a resist on the portions of each outermost copper layer which are to become circuits, and removing the exposed (resist-free) portions of each outermost copper layer by etching.

The present process may comprise:

placing, on each side of an insulating substrate which is not completed, a metal foil which is a laminate of two or three metal layers consisting of a core metal layer and one or two copper layers formed on one or both sides of the core metal layer, the core metal and the copper being different in removing conditions, heating them under pressure to form a laminate, removing only the portions of each copper layer of the laminate where holes for connection of circuit layers are to be drilled (the diameter of each of said portions is slightly larger than the diameter of each hole to be drilled), to form a metallic hollow portion around the mouth of each hole to be drilled, filling a flowable electroconductive substance into each metallic hollow portion, hardening the flowable electroconductive substance, removing each portion of the electroconductive substance protruding from the plane formed by the surface of the unhollowed portion of each copper layer, forming a resist on the portions of each copper layer necessary for circuit formation, including the electroconductive substance-filled hollow portions, removing the exposed (resist-free) copper layer portions by etching, to form an inner layer circuit substrate, placing a prepreg and a copper foil on at least one side of the inner layer circuit substrate, heating them under pressure to form a laminate, drilling holes for connection of circuit layers at the required positions of the laminate, forming a metal layer on the wall of each hole by plating, forming a resist on the portions of each outermost copper layer of the laminate which are to become circuits, and removing the exposed (resist-free) portions of each outermost copper layer by etching.

Figure 6A:
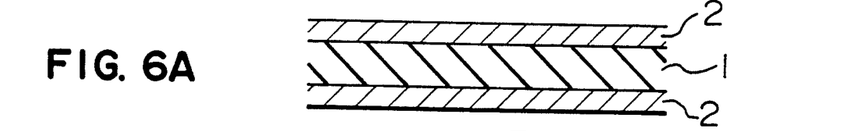
FIGS. 6A to 6F are sectional views explaining the steps of another example of the process of the present invention.
Figure 6B:
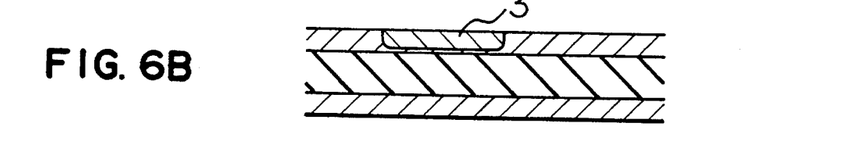
Figure 6C:
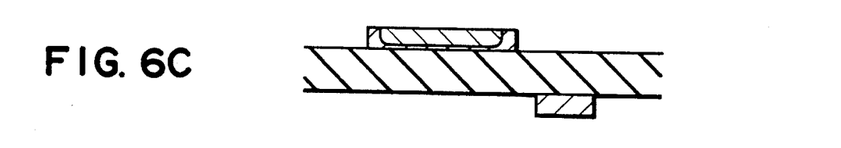
Figure 6D:
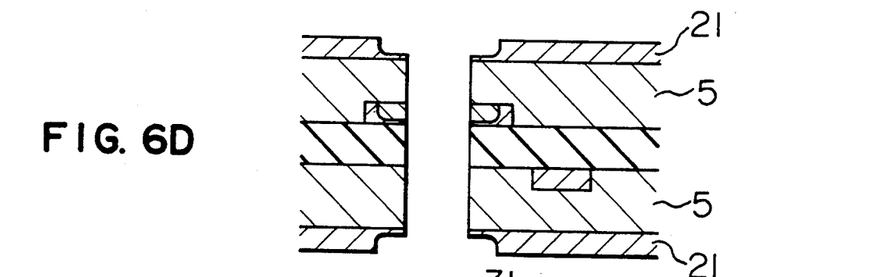
Figure 6E:
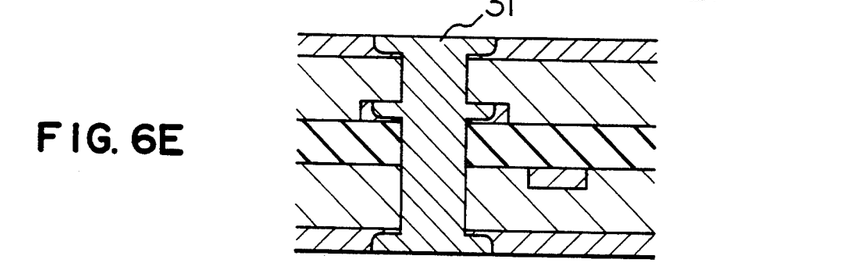

As shown in FIGS. 6A to 6F, the present process may comprise:

placing a copper foil 2 on each side of an insulating substrate 1 which is not completely cured, heating them under pressure to form a laminate (shown in FIG. 6A), removing only the portions of each copper foil 2 where holes for connection of circuit layers are to be drilled (the diameter of each of said portions is slightly larger than the diameter of each hole to be drilled), in such an extent that the insulating substrate 1 is not exposed, to form a metallic hollow portion around the mouth of each hole to be drilled, filling a flowable electroconductive substance 3 into each metallic hollow portion (shown in FIG. 6B), hardening the flowable electroconductive substance 3, removing each portion of the electroconductive substance 3 protruding from the plane formed by the surface of the unhollowed portion of each copper foil, forming a resist on the portions of each conductor (copper foil) necessary for circuit formation, including the electroconductive substance-filled hollow portions, removing the exposed (resist-free) portions of the conductor by etching, to form an inner layer circuit substrate (shown in FIG. 6C), placing a prepreg 5 and a copper foil 21 on at least one side of the inner layer circuit substrate, heating them under pressure to form a laminate, drilling, in the laminate, at least one hole so that the hole passes through one hollow portion of the inner layer circuit substrate filled with the electroconductive substance 3 (accordingly, the diameter of the hole is smaller than the diameter of the hollow portion) and enables connection between inner layer circuit and outer layer circuit, removing the portion of each copper foil 21 around the mouth of each hole drilled above, in such an extent that the prepreg 5 is not exposed, to form a metallic hollow portion around the mouth of each hole (shown in FIG. 6D), and filling a flowable electroconductive substance 31 into each hole and each metallic hollow portion (shown in FIG. 6E).

The present process may comprise:

placing a copper foil on each side of an insulating substrate which is not completely cured, heating them under pressure to form a laminate, removing only the portions of each copper foil of the laminate where holes for connection of circuit layers are to be drilled (the diameter of each of said portions is slightly larger than the diameter of each hole to be drilled), in such an extent that the insulating substrate is not exposed, to form a metallic hollow portion around the mouth of each hole to be drilled, filling a flowable electroconductive substance into each metallic hollow portion, hardening the fluid electroconductive substance, removing each portion of the electroconductive substance protruding from the plane formed by the surface of the unhollowed portion of each copper layer, forming a resist on the portions of each copper layer necessary for circuit formation, including the electroconductive substance-filled hollow portions, removing the exposed (resist-free) copper layer portions by etching, to form an inner layer circuit substrate, placing, on at least one side of the inner layer circuit substrate, a prepreg and a metal foil which is a laminate of two or three metal layers consisting of a core metal layer and one or two copper layers formed on one or both sides of the core metal layer, the core metal and the copper being different in removing conditions, heating them under pressure to form a laminate, drilling, in the laminate, at least one hole so that the hole passes through one hollow portion of the inner layer circuit substrate filled with the electroconductive substance (accordingly, the diameter of the hole is smaller than the diameter of the hollow portion) and enables connection between inner layer circuit and outer layer circuit, removing only the portion of each outermost copper layer around the mouth of each hole, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhollowed portion of each outermost copper layer, forming a resist on the portions of each conductor (copper foil) necessary for circuit formation, including the electroconductive substance-filled hollow portions, and removing the exposed (resist-free) conductor portions by etching.

The present process may comprise:

placing, on each side of an insulating substrate which is not completely cured, a metal foil which is a laminate of two or three metal layers containing a core metal layer and one or two copper layers formed on one or both sides of the core metal layer, the core metal and the copper being different in removing conditions, heating them under pressure to form a laminate, removing only the portions of each copper or core metal layer of the laminate where holes for connection of circuit layers are to be drilled (the diameter of each of said portions is slightly larger than the diameter of each hole to be drilled), to form a metallic hollow portion around the mouth of each hole to be drilled, filling a flowable electroconductive substance into each metallic hollow portion, hardening the flowable electroconductive substance, removing each portion of the electroconductive substance protruding from the plane formed by the surface of the unhollowed portion of the copper or core metal layer, forming a resist on the portions of each conductor (copper or core metal layer) necessary for circuit formation, including the electroconductive substance-filled hollow portions, removing the exposed (resist-free) conductor portions to form an inner layer circuit substrate, placing a prepreg and a copper foil on at least one side of the inner layer circuit substrate, heating them under pressure to form a laminate, drilling, in the laminate, at least one hole so that the hole passes through one hollow portion of the inner layer circuit substrate filled with the electroconductive substance (accordingly, the diameter of the hole is smaller than the diameter of the hollow portion) and enables connection between inner layer circuit and outer layer circuit), removing only the portion of each copper foil of the laminate around the mouth of each hole drilled above, in such an extent that the prepreg is not exposed, to form a metallic hollow portion around the mouth of each hole, and filling a flowable electroconductive substance into each hole and each metallic hollow portion.

The present process may comprise:

placing, on each side of an insulating substrate which is not completely cured, a metal foil which is a laminate of two or three metal layers consisting of a core metal layer and one or two copper layers formed on one or both sides of the core metal layer, the core metal and the copper being different in chemically removing conditions, heating them under pressure to form a laminate, removing only the portions of each copper or core metal layer of the laminate where holes for connection of circuit layers are to be drilled (the diameter of each of said portions is slightly larger than the diameter of each hole to be drilled), to form a metallic hollow portion around the mouth of each hole to be drilled, filling a flowable electroconductive substance into each metallic hollow portion, hardening the flowable electroconductive substance, removing each portion of the electroconductive substance protruding from the plane formed by the surface of the unhollowed portion of the copper or core metal layer, forming a resist on the portions of each conductor (copper or core metal layer) necessary for circuit formation, including the electroconductive substance-filled hollow portions, removing the exposed (resist-free) conductor portions to form an inner layer circuit substrate, placing a prepreg and the same metal foil as above on at least one side of the inner layer circuit substrate, heating them under pressure to form a laminate, drilling, in the laminate, at least one hole so that the hole passes through one hollow portion of the inner layer circuit substrate filled with the electroconductive substance (accordingly, the diameter of the hole is smaller than the diameter of the hollow portion) and enables connection between inner layer circuit and outer layer circuit), removing only the portion of the copper or core metal layer of the laminate around the mouth of each hole drilled above, to form a metallic hollow portion around the mouth of each hole, filling a flowable electroconductive substance into each hole and each metallic hollow portion, hardening the flowable electroconductive substance, removing each portion of the electroconductive substance protruding from the plane formed by the surface of the unhallowed portion of each copper or core metal layer, forming a resist on the portions of each conductor (copper or core metal layer) necessary for circuit formation, including the electroconductive substance-filled hollow portions, and removing the exposed (resist-free) portions of the conductor.

Figure 6F:
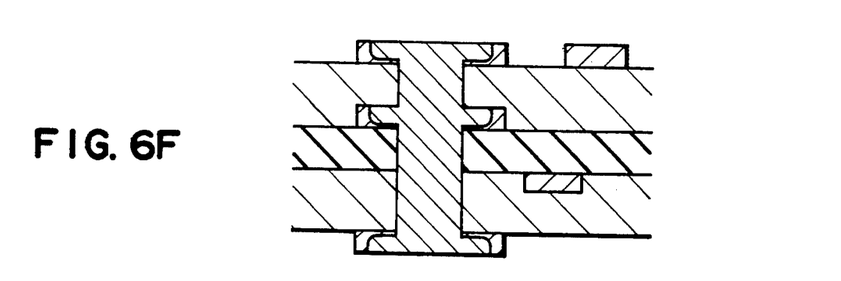
Figure 7H:
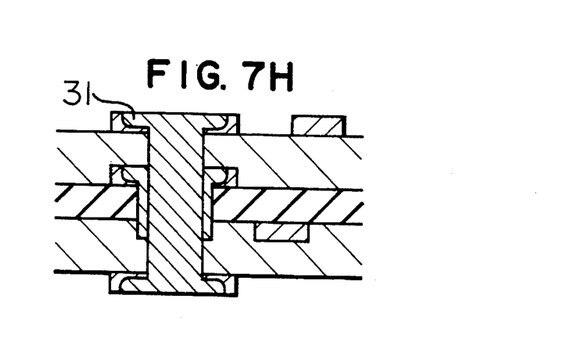

As shown in FIG. 6F or FIG. 7H, the present process may comprise:

after filling a flowable electroconductive substance 31 into each hole and each metallic hollow portion, hardening the flowable electroconductive substance 31, removing each portion of the hardened electroconductive substance 31 protruding from the plane formed by the surface of the unhollowed portion of each outermost metal layer, forming a resist on the portions of each conductor (outermost metal layer) necessary for circuit formation, including the electroconductive substance-filled hollow portions, and removing the exposed (resist-free) portions of each conductor by etching, to obtain a multilayer wiring board.

In FIGS. 1 through 7, numeral 1 denotes an insulating layer, numeral 2 denotes a copper foil, numeral 3 denotes an electroconductive substance, numeral 4 denotes a wiring, numeral 5 denotes a prepreg, numeral 21 denotes a copper foil, and numeral 31 denotes an electroconductive substance, In the present invention, there can be used, as the insulating substrate which is not completely cured, those obtained by impregnating a reinforced fiber (e.g.

glass cloth or paper) with an epoxy resin, a phenolic resin or the like. There can also be used those insulating substrates obtained by coating an adhesive on the surface of a flexible insulating film such as polyester film, polyimide film or the like. The use of an insulating film is preferable because the total thickness of the insulating substrate obtained can be made small and part of the insulating film can also be used as a cable for connection to other circuits.

The metal foil can be a copper foil or a composite metal foil comprising a core metal layer and a copper layer formed on one side or both sides of the core metal layer. When a copper foil is used, the thickness is preferably 20 to 70 $\mu$m. When the thickness is less than 70 $\mu$m, the controlling of etching for forming hollow portions becomes difficult, while when the thickness is more than 70 $\mu$m, the formation of precise wiring becomes difficult due to increased side etching.

In the case of using a two-layer composite metal foil comprising a core layer and a copper foil, the thickness of the layer contacting with the insulating substrate is preferably 1 to 15 $\mu$m and the thickness of the layer remaining as a circuit conductor is preferably 20 to 70 $\mu$m. As the core layer, there can be used a layer of nickel, a nickel-phosphorus alloy, a nickel-boron alloy or solder. The core metal layer and the copper layer should be different in chemically removing conditions, e.g. etching conditions. The layer remaining as a circuit conductor has hollow portions from which only the metal (core metal or copper) is removed by chemically different removing conditions, while the remaining layer copper layer or core metal layer) contacts with the insulating substrate. The layer contacting with the insulating layer should have a minimum thickness necessary for contacting with the electroconductive substance, while the upper layer should have a thickness necessary for forming a wall preventing the flowing of the electroconductive substance into portions other than circuits as a lower limit. The total of the both layers corresponds to an upper limit necessary for conducting precise working of circuits.

In the case of using a three-layer composite metal foil wherein a core layer is sandwiched by copper layers, the copper layer on the core metal layer and not contacting with the insulating substrate corresponds to the layer not contacting with the insulating layer in the case of the two-layer composite metal foil. As mentioned above, such a layer preferably has a thickness of 20 $\mu$m or more so as to prevent the flowing of electroconductive substance outside the circuit portions when the hollow portions are filled, and preferably 70 $\mu$m or less so as to conduct precise working of the circuits. The other copper layer contacting with the insulating substrate preferably has a thickness of 1 to 15 $\mu$m by the same reason as mentioned above. The core metal layer is used as an intermediate layer which acts as a barrier when the copper in the hollow portions is removed by etching. The core metal layer is preferably made as thin as possible. Preferable thickness is 0.05 to 2 $\mu$m. When the thickness is too small, the action as a barrier would be lost. The total thickness of the core metal layer and the copper layer contacting with the insulating substrate is preferably selected so as to correspond to the thickness of the layer contacting with the insulating layer in the case of the two-layer composite metal foil. As a result, the hollow portions can be formed without controlling the amount of metal foil etched.

The diameter of the hollow portion formed in the metal foil is preferably the hole diameter plus 0.1 to 0.6 mm, more preferably the hole diameter plus 0.2 to 0.4 mm. When the diameter is less than the hole diameter +0.1 mm, the contact area between the electroconductive substance and the circuit conductor becomes smaller, and moreover the design becomes difficult due to working errors considering the resist plate and hole position. On the other hand, when the diameter is more than the hole diameter plus 0.6 mm, the area for connecting holes becomes too much, resulting in making other wiring difficult.

As the electroconductive substance, there can be used conventionally used mixtures comprising metal particles, a binder and a solvent, such as silver paste, copper paste and the like. In these mixtures, application of heat evaporates the solvent and hardens the binder, whereby the metal particles are fixed.

When there is used, as the electroconductive substance, a mixture of particles of a low-melting metal (e.g. solder) and a solvent (this mixture is filled into each hole and each hollow portion surrounding the hole and then heated to evaporate the solvent and melt the metal particles, followed by cooling for fixation of the metal), connection resistance can be made small.

When the above mixture of particles of a low-melting metal (e.g. solder) and a solvent is filled into each hole and each hollow portion surrounding the hole and then heated to evaporate the solvent and melt the metal particles, followed by cooling for fixation of the metal, it can be preferably conducted, in order to prevent the solder from flowing, by pressing a laminate comprising a metal plate, a heat-resistant film placed thereon and the above mixture coated on the heat-resistant film.

Figure 1B:
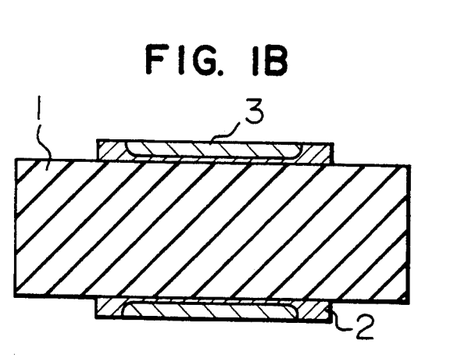

In the wiring board of the present invention, as shown in FIGS. 1A and 1B, the lands have a special structure so as to ensure high connection reliability even when an electoconductive substance is filled into the holes. The structure gives a larger connection area, promises a flat surface even after the filling, and is suited for use also in multilayer wiring boards.

Example 1

MCL-E-67 (trade name) manufactured by Hitachi Chemical Co., Ltd. was used as a laminate formed by placing a copper foil of 35 $\mu$m in thickness on each side of a glass cloth-epoxy resin insulating substrate and then heating them under pressure. Holes for connection of circuit layers were drilled at the required positions of the laminate. An etching resist was formed on the laminate so that the holes and the copper foil portions around the hole mouths were exposed. Based on the relation between the time taken for etching and the thickness of remaining copper foil, obtained beforehand, the exposed (resist-free) copper foil portions were removed so that the thickness of remaining copper foil became about 2 $\mu$m in thickness, whereby a metallic hollow portion was formed around the mouth of each hole. The etching resist was removed by peeling, and a silver paste was filled into each hole and each hollow portion by screen printing.

The filled silver paste was hardened in a dryer of conveyor type. Each portion of the silver paste protruding from the plane formed by the unhollowed portion of each copper foil as well as the silver paste adhering onto the copper foil surface were removed using a grinder. A resist was formed on the portions of each conductor (copper foil) necessary for circuit formation, including the silver paste-filled hollow portions. The exposed (resist-free) conductor portion was removed by etching, to obtain a wiring board.

Example 2

A laminate [MCL-E-67 (trade name) manufactured by Hitachi Chemical Co., Ltd.] was subjected to etching to remove the unnecessary portions of each copper layer of the laminate to form an inner layer circuit substrate. On each side of the inner layer circuit substrate was placed a prepreg [GEA-67N (trade name) manufactured by Hitachi Chemical, Co., Ltd.]. On each prepreg was further placed a copper foil of 35 $\mu$m in thickness. They were heated under pressure to form a laminate. Holes for connection of circuit layers were drilled at the required positions of the laminate. An etching resist as formed on the laminate so that the holes and the copper foil portions around the hole mouths were exposed. Based on the relation between the time taken for etching and the thickness of remaining copper foil, obtained beforehand, the exposed (resist-free) copper foil portions were removed so that the thickness of remaining copper foil became about 5 $\mu$m in thickness, whereby a metallic hollow portion was formed around the mouth of each hole. The etching resist was removed by peeling, and a silver paste was filled into each hole and each hollow portion by screen printing.

The filled silver paste was hardened in a dryer of conveyor the Each portion of the silver paste protruding from the plane formed by the unhollowed portion of each copper foil as well as the silver paste adhering onto the copper foil surface were removed using a grinder. A resist was formed on the portions of each conductor (copper foil) necessary for circuit formation, including the silver paste-filled hollow portions. The exposed (resist-free) conductor portion was removed by etching, to obtain a wiring board.

Example 3

On each side of a prepreg which was a glass cloth-epoxy resin insulating substrate [GEA-67N (trade name) manufactured by Hitachi Chemical Co., Ltd.], was placed a metal foil which was a three-layer laminate comprising a core nickel layer and two copper layers formed on both sides of the core nickel layer by electroless plating. They were heated under pressure to form a laminate. An etching resist was formed on the laminate so that only the portions of the laminate where holes for connection of circuit layers were to be drilled (the diameter of each of said portions was slightly larger than the diameter of each hole to be drilled), were exposed. Only the copper layer of each exposed (resist-free) laminate portion was removed using an alkali etchant consisting of tetramminecopper (II) salt, ammonium chloride and ammonia, to form a metallic hollow portion around the mouth of each hole to be drilled. A hole was drilled in each hollow portion. A copper paste was grilled into each hole and each hollow portion by screen printing.

The filled copper paste was hardened in a dryer of conveyor type. Each portion of the copper paste protruding from the plane formed by the unhollowed portion of each copper foil as well as the copper paste adhering onto the copper foil surface were removed using a grinder. A resist was formed on the portions of each conductor (copper foil) necessary for circuit formation, including the copper paste-filled hollow portions. The exposed (resist-foil) conductor portion was removed by etching, to obtain a wiring board.

Example 4

A laminate [MCL-E-67 (trade name) manufactured by Hitachi Chemical Co., Ltd.] was subjected to etching to remove the unnecessary portions of each copper layer of the laminate to form an inner layer circuit substrate. On each side of the inner layer circuit substrate was placed a prepreg [GEA-67N (trade name) manufactured by Hitachi Chemical, Co., Ltd.]. On each prepreg was further placed a metal foil which was a three-layer laminate comprising a core metal layer (made of a nickel-phosphorus alloy) and two copper layers formed on both sidles of the core metal layer by electroless plating. They were heated under pressure to form a laminate. An etching resist was formed on the laminate so that only the portions of the laminate where holes for connection of circuit layers were to be drilled (the diameter of each of said portions was slightly larger than the diameter of each hole to be drilled), were exposed. Only the copper layer of each exposed (resist-free) laminate portion was removed using an alkali etchant consisting of tetramminecopper (II) salt, ammonium chloride and ammonia, to form a metallic hollow portion around the mouth of each hole to be drilled. A hole was drilled in each hollow portion. A copper paste was filled into each hole and each hollow portion by screen printing.

The filled copper paste was hardened in a dryer of conveyor type. Each portion of the copper paste protruding from the plane formed by the unhollowed portion of each copper foil as well as the silver paste adhering onto the copper foil surface were removed using a grinder. A resist was formed on the portions of each conductor (copper foil) necessary for circuit formation, including the copper paste-filled hollow portions. The exposed (resist-free) conductor portion was removed by etching, to obtain a wiring board.

Example 5

On each side of the same inner layer circuit substrate as used in Example 1 were placed a prepreg [GEA-67N (trade naive) manufactured by Hitachi Chemical Co., Ltd.] and a copper foil of 35 $\mu$m in thickness. They were heated under pressure to form a laminate. Holes for connection of circuit layers were drilled at the required positions of the laminate. The resulting laminate was subjected to a pretreatment for plating, seeding, a sensitization treatment and an electroless plating treatment to form a metal layer on the wall of each hole. A resist was formed on the portions of the outermost copper layer which were to become circuits. The exposed (resist-free) portion of the outermost copper layer was removed by etching, to obtain a wiring board.

Example 6

On each side of the same inner layer circuit substrate as used in Example 2 were placed a prepreg [GEA-67N (trade name) manufactured by Hitachi Chemical Co., Ltd.] and a copper foil of 35 $\mu$m in thickness. They were heated under pressure to form a laminate. Holes for connection of circuit layers were drilled at the required positions of the laminate. The resulting laminate was subjected to a pretreatment for plating, seeding, a sensitization treatment and an electroless plating treatment to form a metal layer on the wall of each hole. A resist was formed on the portions of the outermost copper layer which were to become circuits. The exposed (re-

Example 7

On each side of a prepreg which was a glass cloth-epoxy resin insulating substrate [GEA-67N (trade name) manufactured by Hitachi Chemical Co., Ltd.], was placed a metal foil which was a three-layer laminate consisting of a core nickel layer and two copper layers formed on both sides of the core nickel layer by electroless plating. They were heated under pressure to form a laminate. An etching resist was formed on the laminate so that only the portions of the laminate where holes for connection of circuit layers were to be drilled (the diameter of each of said portions was slightly larger than the diameter of each hole to be drilled), were exposed. Only the copper layer of each exposed (resist-free) laminate portion was removed using an alkali etchant comprising tetramminecopper (II) salt, ammonium chloride and ammonia, to form a metallic hollow portion around the mouth of each hole to be drilled. A copper paste was filled into each hollow portion by screen printing. The filled copper paste was hardened in a dryer of conveyor type. Each portion of the copper paste protruding from the plane formed by the surface of the unhollowed portion of each copper layer, as well as the copper paste adhering onto each copper layer were removed using a grinder. A resist was formed on the portions of the conductor (copper layer) necessary for circuit formation, including the copper paste-filled hollow portions. The exposed (resist-free) portion of the conductor was removed by etching, to form an inner layer circuit substrate. On each side of the inner layer circuit substrate were placed a prepreg [GEA-67N (trade name) manufactured by Hitachi Chemical Co., Ltd.] and a copper foil of 35 $\mu$m in thickness. They were heated under pressure to form a laminate. Holes for connection of circuit layers were drilled at the required positions of the laminate. The resulting laminate was subjected to a pretreatment for plating, seeding, a sensitization treatment and an electroless plating treatment to form a metal layer on the wall of each hole. A resist was formed on the portions of the outermost copper layer which were to become circuits. The exposed (resist-free) portion of the outermost copper layer was removed by etching, to obtain a wiring board.

Example 8

On each side of the same inner layer circuit substrate as used in Example 4 were placed a prepreg [GEA-67N (trade name) manufactured by Hitachi Chemical Co., Ltd.] and a copper foil of 35 $\mu$m in thickness. They were heated under pressure to form a laminate. Holes for connection of circuit layers were drilled at the required positions of the laminate. The resulting laminate was subjected to a pretreatment for plating, seeding, a sensitization treatment and an electroless plating treatment to form a metal layer on the wall of each hole. A resist was formed on the portions of the outermost copper layer which were to become circuits. The exposed (resist-free) portion of the outermost copper layer was removed by etching, to obtain a wiring board.

Example 9

On each side of the same inner layer circuit substrate as used in Example 1 (the diameter of each hole filled with the silver paste was 1.5 mm) were placed a prepreg [GEA-67N (trade name) manufactured by Hitachi Chemical Co., Ltd.] and a copper foil of 35 $\mu$m in thickness. They were heated under pressure to form a laminate. Holes for connection of inner layer circuit and outer layer circuit, each having a diameter of 0.8 mm were drilled in the laminate so that each hole passed through one hole of the inner layer circuit substrate filled with the silver paste. An etching resist was formed on the laminate so that the holes and their vicinities were exposed. Based on the relation between the time taken for etching and the thickness of remaining copper foil, obtained beforehand, the exposed (resist-free) copper foil portions were removed so that the thickness of remaining copper foil became about half of the original thickness, whereby a metallic hollow portion was formed around the mouth of each hole. The etching resist was removed by peeling, and the same silver paste was filled into each hole and each hollow portion by screen printing.

The filled silver paste was hardened in a dryer of conveyor type. Each portion of the silver paste protruding from the plane formed by the unhollowed portion of each copper foil as well as the silver paste adhering onto the copper foil surface were removed using a grinder. A resist was formed on the portions of each conductor (copper foil) necessary for circuit formation, including the silver paste-filled hollow portions. The exposed (resist-free) conductor portion was removed by etching, to obtain a wiring board.

Example 10

On each side of the same inner layer circuit substrate as used in Example 3 (the diameter of each hole filled with the silver paste was 1.5 mm) were placed a prepreg [GEA-67N (trade name) manufactured by Hitachi Chemical Co., Ltd.] and a metal foil which was a three-layer laminate consisting of a core metal layer (made of a nickel-boron alloy) and two copper layers formed on both sides of the core metal layer by electroless plating. They were heated under pressure to form a laminate. Holes for connection of inner layer circuit and outer layer circuit, each having a diameter of 0.8 mm were drilled at the required positions of the laminate. An etching resist was formed on the laminate so that the holes and their vicinities were exposed. Only the copper layers of the exposed laminate portions were removed using an alkali etchant comprising tetraminecopper (II) salt, ammonium chloride and ammonia, to form a metallic hollow portion around the mouth of each hole. The etching resist was removed by peeling, and the same silver paste was filled into each hole and each hollow portion by screen printing.

The filled silver paste was hardened in a dryer of conveyor type. Each portion of the silver paste protruding from the plane formed by the unhollowed portion of each copper foil as well as the silver paste adhering onto the copper foil surface were removed using a grinder. A resist was formed on the portions of each conductor (copper foil) necessary for circuit formation, including the silver paste-filled hollow portions. The exposed (resist-free) conductor portion was removed by etching, to obtain a wiring board.

Example 11

On each side of the same inner layer circuit substrate as used in Example 2 were placed a prepreg [GEA-67N (trade name) manufactured by Hitachi Chemical Co., Ltd.] and a copper foil of 35 $\mu$m in thickness. They were heated under pressure to form a laminate. Holes for connection of inner layer circuit and outer layer circuit, each having a diameter of 0.8 mm were drilled in the laminate so that each hole passed through one hole of the inner layer circuit substrate filled with the silver paste. An etching resist was formed on the laminate so that the holes and their vicinities were exposed. Based on the relation between the time taken for etching and the thickness of remaining copper foil, obtained beforehand, the exposed (resist-free) copper foil portions were removed so that the thickness of remaining copper foil became about half of the original thickness, whereby a metallic hollow portion was formed around the mouth of each hole. The etching resist was removed by peeling, and the same silver paste was filled into each hole and each hollow portion by screen printing.

The filled silver paste was hardened in a dryer of conveyor type. Each portion of the silver paste protruding from the plane formed by the unhollowed portion of each copper foil as well as the silver paste adhering onto the copper foil surface were removed using a grinder. A resist was formed on the portions of each conductor (copper foil) necessary for circuit formation, including the silver paste-filled hollow portions. The exposed (resist-free) conductor portion was removed by etching, to obtain a wiring board.

Example 12

A laminate [MCL-E-67 (trade name) manufactured by Hitachi Chemical Co., Ltd.] was subjected to etching to remove the unnecessary portions of each copper layer of the laminate to form an inner layer circuit substrate. On each side of the inner layer circuit substrate was placed a prepreg [GEA-67N (trade name) manufactured by Hitachi Chemical, Co., Ltd.]. On each prepreg was further-placed a metal foil which was a three-layer laminate consisting of a core metal layer (made of a nickel-phosphorus alloy) and two copper layers formed on both sides of the core metal layer by electroless plating. They were heated under pressure to form a laminate. An etching resist was formed on the laminate so that only the portions of the laminate where holes for connection of circuit layers were to be drilled (the diameter of each of said portions was slightly larger than the diameter of each hole to be drilled), were exposed. Only the copper layer of each exposed (resist-free) laminate portion was removed using an alkali etchant comprising tetramminecopper (II) salt, ammonium chloride and ammonia, to form a metallic hollow portion around the mouth of each hole to be drilled. A copper paste was filled into each hollow portion by screen printing. The filled copper paste was hardened in a dryer of conveyor type. Each portion of the copper paste protruding from the plane formed by the surface of the unhollowed portion of each copper layer, as well as the copper paste adhering onto each copper layer were removed using a grinder. A resist was formed on the portions of the conductor (copper layer) necessary for circuit formation, including the copper paste-filled hollow portions. The exposed (resist-free) portion of the conductor was removed by etching, to form an inner layer circuit substrate (the diameter of each hole filled with the copper paste was 1.5 mm). On each side of the inner layer circuit substrate were placed a prepreg [GEA-67N (trade name) manufactured by Hitachi Chemical Co., Ltd.] and a metal foil which was a three-layer laminate comprising a core metal layer (made of a nickel-boron alloy) and two copper layers formed on both sides of the core metal layer by electroless plating.

They were heated under pressure to form a laminate. Holes for connection of inner layer circuit and outer layer circuit, each having a diameter of 0.8 mm were drilled at the required positions of the laminate. An etching resist was formed on the laminate so that the holes and their vicinities were exposed. Only the copper layers of the exposed laminate portions were removed using an alkali etchant comprising tetramminecopper (II) salt, ammonium chloride and ammonia, to form a metallic hollow portion around the mouth of each hole. The etching resist was removed by peeling, and the same copper paste was filled into each hole and each hollow portion by screen printing.

The filled copper paste was hardened in a dryer of conveyor type. Each portion of the copper paste protruding from the plane formed by the unhollowed portion of each copper foil as well as the copper paste adhering onto the copper foil surface were removed using a grinder. A resist was formed on the portions of each conductor (copper foil) necessary for circuit formation, including the copper paste-filled hollow portions. The exposed (resist-free) conductor portion was removed by etching, to obtain a wiring board.

Example 13

A wiring board was obtained in the same manner as in Example 1 except that a solder paste consisting of particles of a low-melting metal (e.g. solder) and a solvent was used in place of the silver paste and that the paste, after being filled into each hole and each hollow portion, was heated in a dryer of conveyor type to evaporate the solvent and melt the solder, followed by cooling and fixation of solder.

Example 14

A wiring board was obtained in the same manner as in Example 2 except that MCL-437F (trade name) manufactured by Hitachi Chemical Co., Ltd., a laminate of paper-phenolic resin and a copper foil of 35 $\mu$m in thickness was used in place of MCL-E-67.

Example 15

A wiring board was obtained in the same manner as in Example 1 except that there was used, in place of MCL-E-67, a copper-clad laminated film obtained by laminating a polyester film and a copper film of 35 $\mu$m in thickness using an adhesive.

Example 16

A wiring board was obtained in the same manner as in Example 13 except that there was used, as a laminate, a solder-plated copper-clad laminated film obtained by laminating a polyimide film and a solder-plated copper foil using an adhesive.

Evaporation of solvent and melting of low-melting metal particles by heat after filling of each hole and each hollow portion and subsequent cooling and fixation of molten metal particles were conducted by attaching, to both sides of the above laminate, the polyimide film (heat-resistant film) side of an aluminum plate (1 mm in thickness)-polyimide film laminate and them placing them in a heating furnace.

As is clear from the above, the wiring boards of the present invention, as compared with ordinary wiring boards having through-holes, could be produced without conducting electroless plating. Therefore, it is expected that the present wiring boards can be produced at a fully automated production line. Further, since the time fox-plating, which occupies a large portion of the total process time, can be eliminated, the present wiring boards can be produced at a fairly low cost.

The present wiring boards had about the same properties (except for electrical properties) as ordinary wiring boards did. Those using solder had about the same properties as other wiring boards except that they must be used at temperatures lower than the melting point of the solder.

With respect to the electrical properties, the present wiring boards using solder had about the same properties as ordinary wiring boards did. Although they showed slight reduction in voltage when used in circuits where a large amount of electricity flowed, and could not be used in circuits of severe requirement such as ECL circuit and the like, they could be practically used similarly to conventional wiring boards, in appliances using C-MOS semiconductors of low electricity consumption, such as portable word processor, personal computer and the like.

As described above, the present invention can provide an inexpensive wiring board of high wiring density having about the same properties as conventional wiring boards, and a process for producing such a wiring board efficiently.

What is claimed is:

1. A wiring board for inner layer circuit comprising an insulating layer and metal foil layers formed on both sides of the insulating layer, said metal foil layers each having one or more hollow portions formed therein, said hollow portions being filled with an electroconductive substance, wherein a hole is to be drilled in each hollow portion so that a part of the hollow portion remains around an end of the hole.

2. A wiring board according to claim 1, wherein the metal foil is a copper foil.

3. A wiring board for an inner layer circuit comprising an insulating layer and metal foil layers formed on both sides of the insulating layer, said metal foil layers having one or more hollow portions wherein a hole is to be drilled in a hollow portion, said hollow portions being filled with an electroconductive substance and the metal foil is a composite metal foil comprising a core metal layer and a copper layer formed on one side or both sides of the metal core layer, said core metal layer and said copper layer being different in chemically removing conditions.

4. A wiring board comprising an insulating layer and metal foil layers formed on both sides of the insulating layer and one or more holes formed through the insulating layer and the metal foil layers, a narrow portion around an end of each hole in the metal foil layers being hollowed, and hollowed portions and holes being filled with an electroconductive substance.

5. A wiring board according to claim 4, wherein the metal foil is a copper foil.

6. A wiring board comprising an insulating layer and metal foil layers formed on both sides of the insulating layer and one or more holes formed through the insulating layer and the metal foil layers, a narrow portion around each hole in the metal foil layers being hollowed, and hollow portions and holes being filled with an electroconductive substance; the metal foil being a composite metal foil comprising a core metal layer and a copper layer formed on one side or both sides of the metal core layer, said core metal layer and said copper layer being different in chemically removing conditions and the hollow portions being formed in either said core metal layer or said copper layer.

7. A wiring board comprising one or more inner layer circuit substrates and prepegs laminated alternately to form a laminate and outer circuit layers formed from metal foil layers on both outmost sides of said laminate, each inner layer circuit substrate comprising an insulating layer and metal foil layers formed on both sides of said insulating layer, at least one inner layer circuit substrate or at least one of said outer circuit layers or both an inner layer circuit substrate and an outer circuit layer having hollow portions in the metal foil layers, which hollow portions are filled with an electroconductive substance, said wiring board having at least one through-hole extending through the laminate at least in one of the hollow portions, each through-hole formed in a hollow portion being filled with the electroconductive substance.

8. A wiring board according to claim 7, wherein the metal foil is a copper foil.

9. A wiring board according to claim 7, wherein the metal foil is a composite metal foil comprising a core metal layer and a copper layer formed on one side or both sides of the core metal layer, said core metal layer and said copper layer being different in chemically removing conditions and the hollow portions being formed in either said core metal layer or said copper layer.

* * * * *